United States Patent
Wan et al.

(10) Patent No.: US 9,047,970 B2
(45) Date of Patent: Jun. 2, 2015

(54) WORD LINE COUPLING FOR DEEP PROGRAM-VERIFY, ERASE-VERIFY AND READ

(71) Applicant: SanDisk Technologies Inc., Plano, TX (US)

(72) Inventors: Jun Wan, San Jose, CA (US); Feng Pan, Fremont, CA (US); Bo Lei, San Ramon, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/065,092

(22) Filed: Oct. 28, 2013

(65) Prior Publication Data

US 2015/0117114 A1    Apr. 30, 2015

(51) Int. Cl.
G11C 16/06    (2006.01)
G11C 16/26    (2006.01)
G11C 16/34    (2006.01)

(52) U.S. Cl.
CPC ............ G11C 16/26 (2013.01); G11C 16/3459 (2013.01)

(58) Field of Classification Search
CPC .. G11C 11/5642; G11C 8/10; G11C 11/4091; G11C 16/26; G11C 8/08; G11C 16/28
USPC .............. 365/185.21, 185.23, 185.18, 230.06
See application file for complete search history.

(56) References Cited

U.S. PATENT DOCUMENTS

| | | | |
|---|---|---|---|
| 6,091,101 A | 7/2000 | Wang | |
| 6,181,601 B1 | 1/2001 | Chi | |
| 6,754,131 B2 | 6/2004 | Kirsch et al. | |
| 6,870,768 B2 | 3/2005 | Cernea et al. | |
| 7,492,633 B2 | 2/2009 | Mokhlesi | |
| 7,606,074 B2 | 10/2009 | Wan et al. | |
| 7,688,635 B2 * | 3/2010 | Tang | 365/185.21 |
| 7,876,618 B2 | 1/2011 | Lee et al. | |
| 7,889,560 B2 | 2/2011 | Guterman | |
| 2006/0028870 A1 | 2/2006 | Roohparvar | |
| 2009/0282184 A1 | 11/2009 | Dutta et al. | |
| 2010/0097861 A1 | 4/2010 | Dutta et al. | |

(Continued)

OTHER PUBLICATIONS

Crippa, L., et al., "Nonvolatile Memories: NOR vs. NAND Architectures," Chapter 2, Memories in Wireless Systems, Springer Copyright 2008, 26 pages.

(Continued)

*Primary Examiner* — David Lam
(74) *Attorney, Agent, or Firm* — Vierra Magen Marcus LLP

(57) ABSTRACT

In a non-volatile storage system, a reduced voltage is provided on a selected word line during a sensing operation, using down coupling from one or more adjacent word lines. Voltages of one or more adjacent word lines of a selected word line are driven down while a voltage of the selected word line is floated. Capacitive coupling from the one or more adjacent word lines to the selected word line reduces the voltage of the selected word line. The capacitive coupling can be provided during a read, a program-verify test or an erase-verify test. The erase-verify test can be performed on cells of even-numbered word lines while capacitive coupling is provided by odd-numbered word lines, or on cells of odd-numbered word lines while capacitive coupling is provided by even-numbered word lines. Voltages of non-adjacent word lines can be provided at fixed, pass voltage levels.

20 Claims, 12 Drawing Sheets

(56) References Cited

U.S. PATENT DOCUMENTS

2011/0134697 A1   6/2011   Zhao et al.
2012/0081963 A1   4/2012   Dutta et al.

OTHER PUBLICATIONS

International Search Report & The Written Opinion of the International Searching Authority dated Feb. 4, 2015.

* cited by examiner

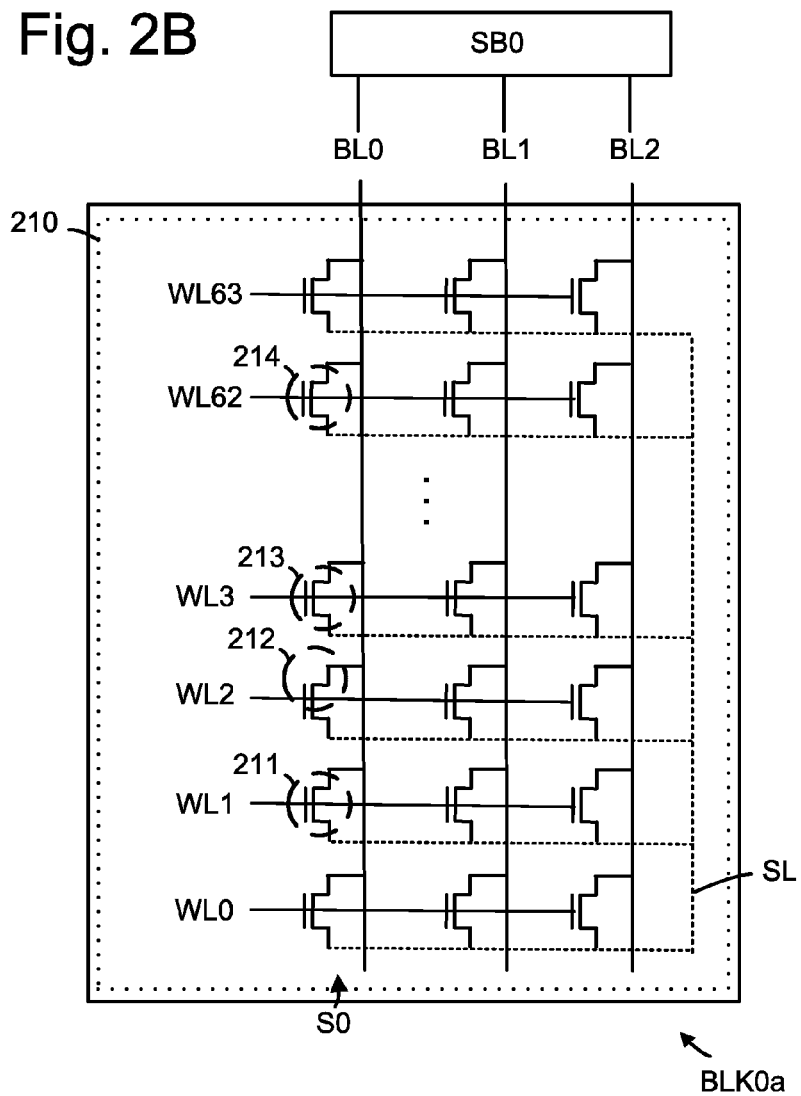
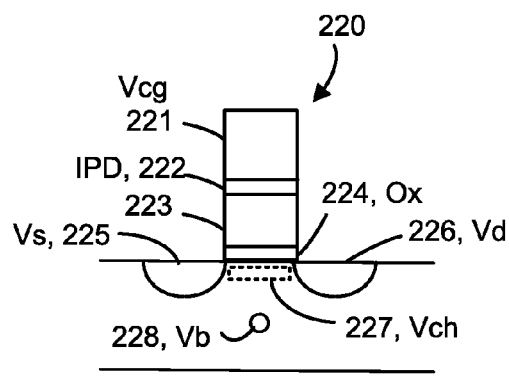

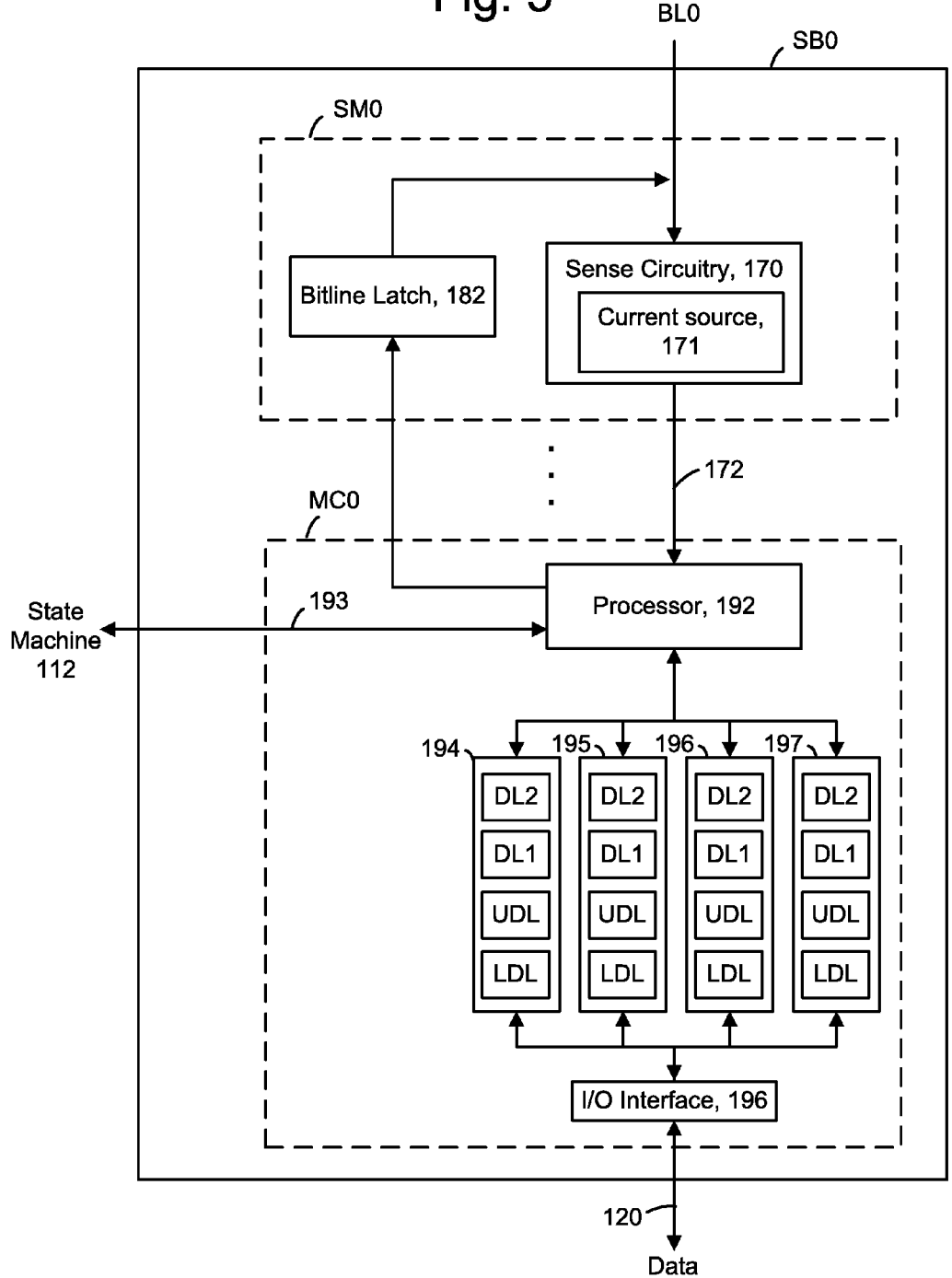

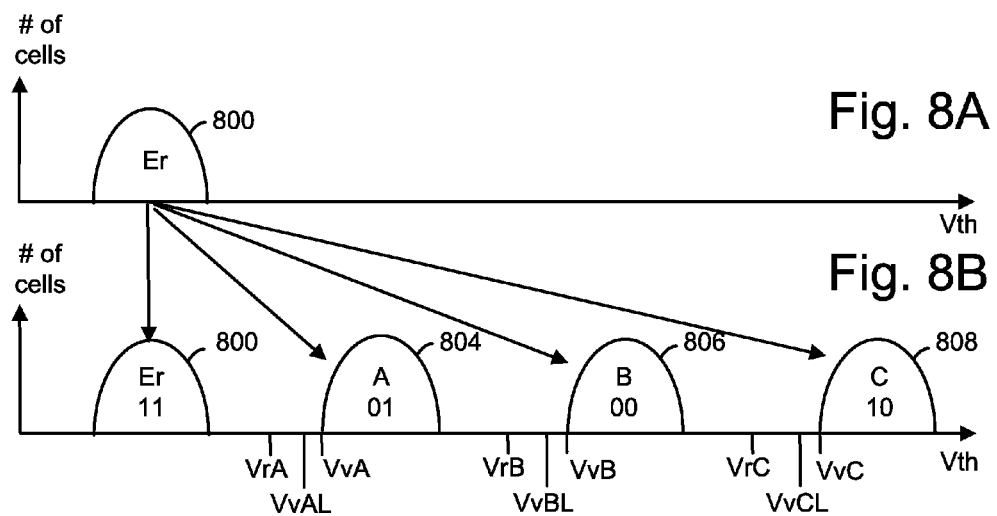
Fig. 8A
Fig. 8B
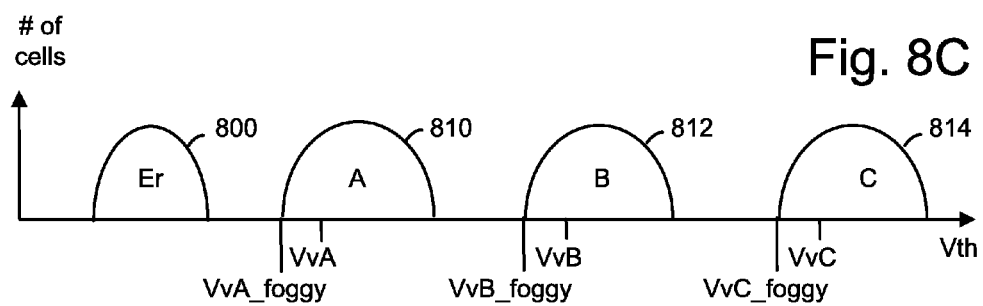
Fig. 8C

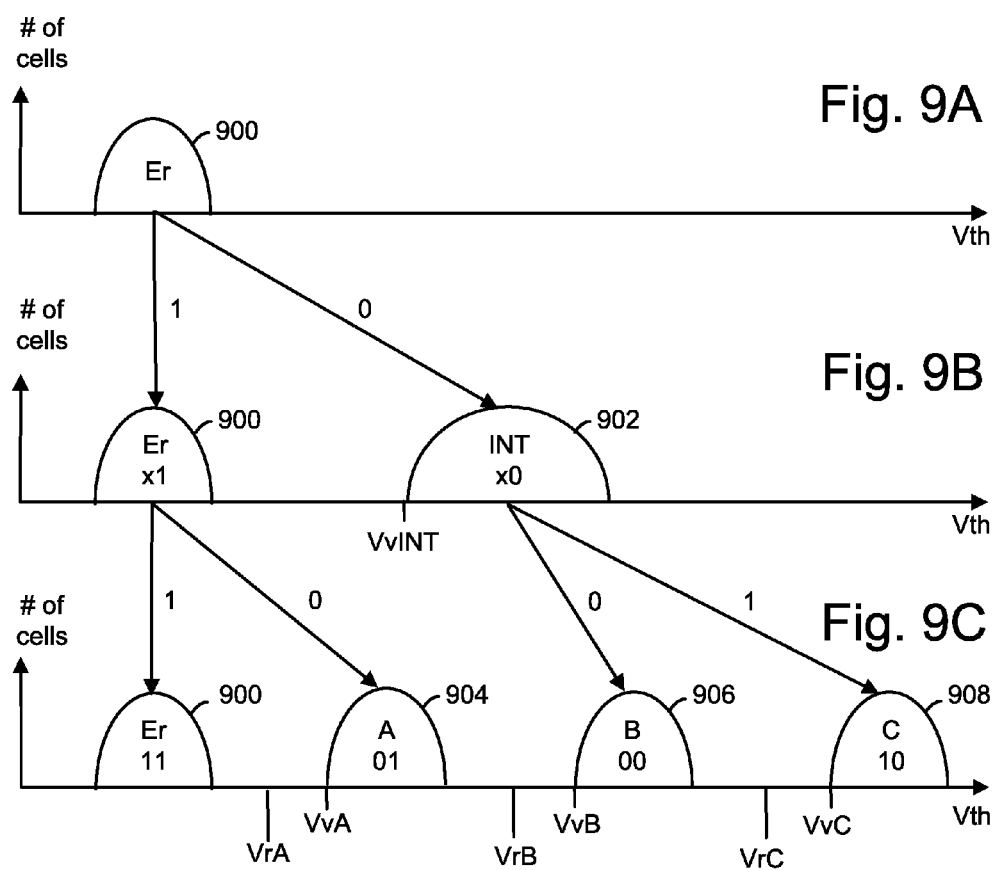

Fig. 10A
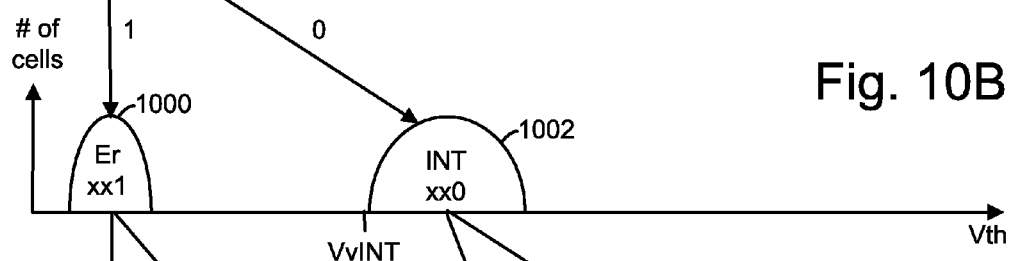
Fig. 10B
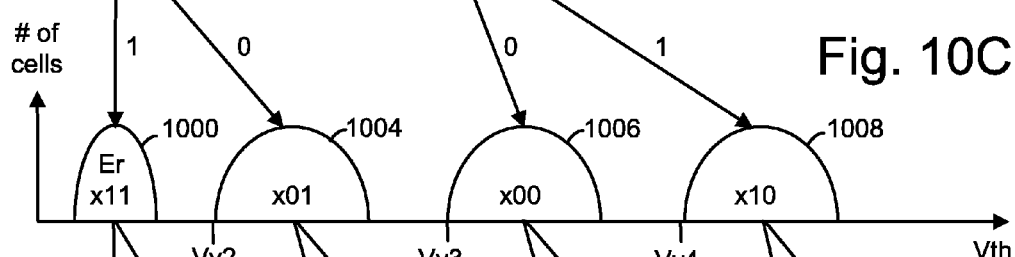
Fig. 10C
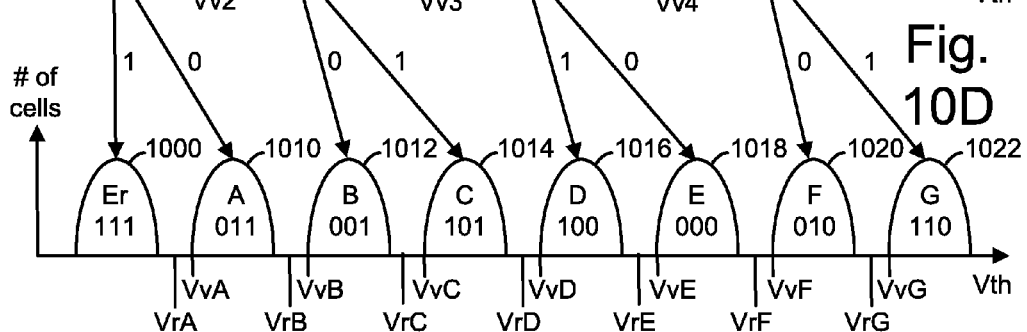
Fig. 10D
Fig. 11
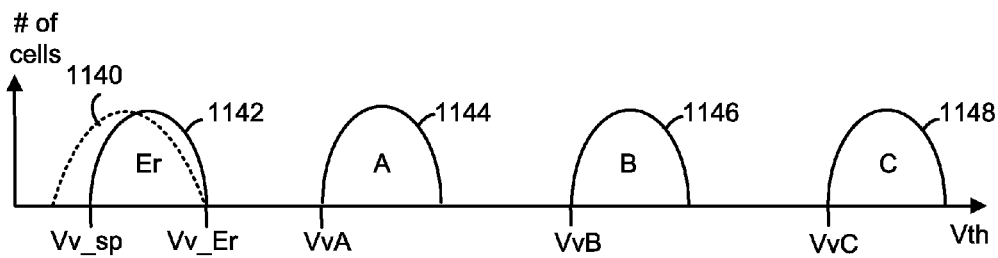

WORD LINE COUPLING FOR DEEP PROGRAM-VERIFY, ERASE-VERIFY AND READ

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

During a sensing operation, a voltage is applied to the control gate of a memory cell while a determination is made as to whether the memory cell is in a conductive state. If the memory cell is in a conductive state, its threshold voltage is less than the control gate voltage. On the other hand, if the memory cell is in a non-conductive state, its threshold voltage is greater than the control gate voltage. However, it can be problematic to provide a sufficiently low control gate voltage for sensing operations which occur during erase-verify, and during program-verify or read operations for lower programmed states.

BRIEF DESCRIPTION OF THE DRAWINGS

FIG. 2B depicts a NOR configuration of a block BLK0a of flash memory cells in the memory array 155 of FIG. 1 and an associated sense block SB0.

FIG. 2C depicts an example flash memory cell 220.

FIG. 5 is a block diagram depicting one embodiment of the sense block SB0 of FIG. 1.

FIGS. 8A and 8B depict Vth distributions in a single pass programming operation which uses four data states.

FIG. 8C depicts Vth distributions after programming using foggy verify levels following the Vth distribution of FIG. 8A.

FIGS. 9A-C depict programming of lower and upper pages in two-bit, four-level memory cells.

FIGS. 10A-D depict programming of lower, middle and upper pages in three-bit, eight-level memory cells.

FIG. 11 depicts example threshold voltage distributions of an erased state and higher data states for a set of non-volatile memory cells.

DETAILED DESCRIPTION

A method in a non-volatile storage system, and a corresponding non-volatile storage system, are provided in which a reduced voltage can be provided on a selected word line during a sensing operation, using down coupling from one or more adjacent word lines.

As mentioned at the outset, it can be difficult to provide a sufficiently low control gate voltage for sensing operations. For example, generating a negative control gate voltage involves negative boosters and high-voltage transistors, which take up space and consume power. Further, a triple-well substrate may be required which increases the die size and the number of process steps.

Techniques provided herein can provide lower control gate voltages, including negative control gate voltages without modifying existing memory designs. In one approach, voltages of one or more adjacent word lines of a selected word line are driven down while a voltage of the selected word line is floated. Capacitive coupling from the one or more adjacent word lines to the selected word line provides a substantial and predictable reduction in the voltage of the selected word line. Moreover, a specific amount of capacitive coupling can be set based on a specific voltage decreases of the one or more adjacent word lines.

The one or more adjacent word lines comprise a word line on a source side of the selected word line and a word line on a drain side of the selected word line. In a sensing operation, the amount of capacitive coupling from an adjacent word line may be limited when the memory cells on the adjacent word line are programmed. In this case, the voltage of the adjacent word line can be driven down but remains above a level which is sufficient to keep the programmed memory cells in a conductive state during sensing. On the other hand, if an adjacent word line comprises erased memory cells but not programmed memory cells, the voltage can be driven down relatively lower, resulting in greater capacitive coupling. A peak level of the voltage may also be set so that it is not so high that it results in inadvertent programming of memory cells on the adjacent word line.

The capacitive coupling can be provided during a read operation, in which the data state of a cell is determined, a programming operation, in which a program-verify test determines a programming progress of a cell, or an erase operation, in which an erase-verify test determines an erase progress of a cell. An erase-verify test can be performed on cells of even-numbered word lines while capacitive coupling is provided by odd-numbered word lines, or on cells of odd-numbered word lines while capacitive coupling is provided by even-numbered word lines. Voltages of non-adjacent word lines can be provided at fixed, pass voltage levels.

An example memory system which can be used is discussed next. Generally, any type of non-volatile memory can be used. Examples include flash memory in the NOR or NAND configurations.

Figure 1:
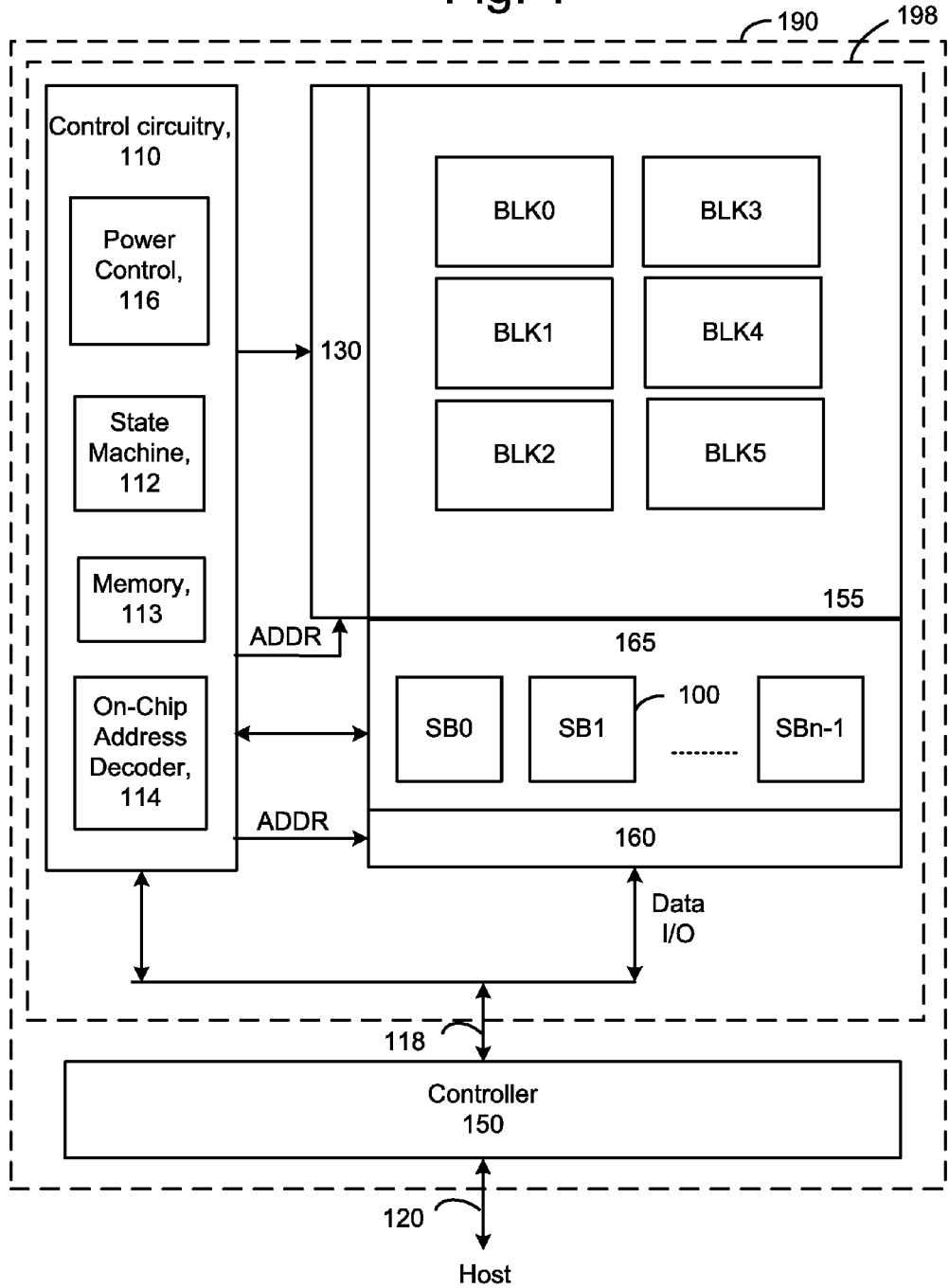
FIG. 1 is a block diagram of a non-volatile memory system using single row/column decoders and read/write circuits.

FIG. 1 is a block diagram of a non-volatile memory system using single row/column decoders and read/write circuits. The diagram illustrates a memory device 190 having read/write circuits for reading and programming a page of memory cells in parallel, according to one embodiment. Memory device 190 may include one or more memory die 198. Memory die 198 includes a two-dimensional memory array of memory cells 155, control circuitry 110, and read/write circuits 165. The array can include blocks of memory cells such as BLK0-BLK5.

In some embodiments, the array of memory cells can be three dimensional. The memory array 155 is addressable by word lines via a row decoder 130 and by bit lines via a column decoder 160. The read/write circuits 165 include multiple sense blocks 100 and allow a page of memory cells to be read or programmed in parallel. Typically a controller 150 is included in the same memory device 190 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. See also FIG. 4. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 in FIG. 5), read/write circuits 165, and controller 150, etc. The sense block 100 is discussed further in connection with FIG. 5.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
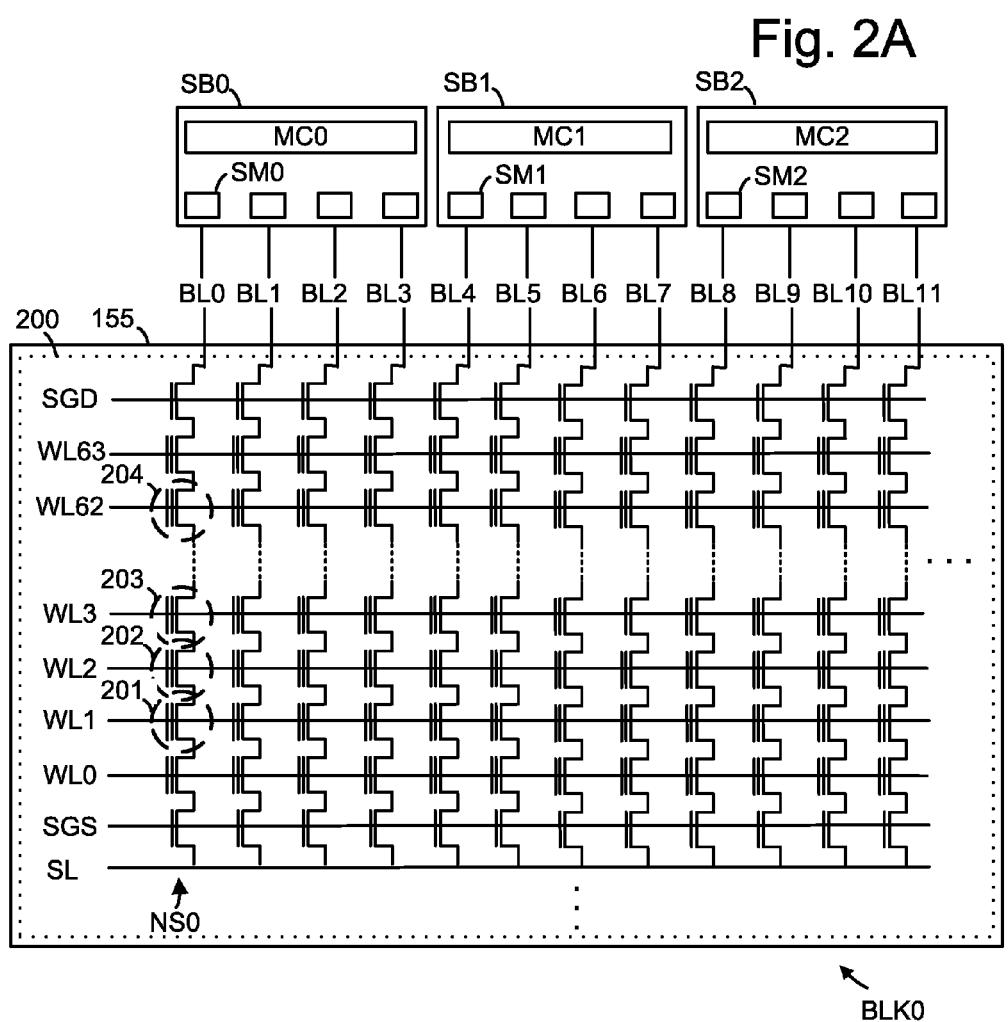
FIG. 2A depicts a NAND configuration of a block of flash memory cells in the memory array 155 of FIG. 1 and associated sense blocks SB0, SB1, SB2 . . . .

FIG. 2A depicts a NAND configuration of a block of flash memory cells in the memory array 155 of FIG. 1 and associated sense blocks SB0, SB1, SB2 .... The memory array can include many blocks. An example block BLK0 includes a number of NAND strings and respective bit lines, e.g., BL0-BL11, ... which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line (SL). Sixty-four word lines, for example, WL0-WL63, extend between the source select gates and the drain select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 5.

An example NAND string NS0 includes memory cells 201, 202, 203, ..., 204 connected to word lines WL1, WL2, WL3, ..., WL62, respectively. The memory cells of BLK0 and other blocks, not shown, are formed in a well region 200 in a substrate. See also FIGS. 3A and 3B. In the NAND configuration, the memory cells are arranged in a string in which the source terminal of one cell is connected to the drain terminal of an adjacent cell. In some examples below, cell 202 is an example of a selected cell and WL2 is a selected word line. Cell 201 is a programmed, adjacent, source-side cell of the selected cell and WL1 is a programmed, adjacent, source-side word line of the selected word line. Cell 203 is an erased, adjacent, drain-side cell of the selected cell and WL3 is an eased, adjacent, drain-side word line of the selected word line. This assumes a programming order in which the memory cells are programmed one word line at a time starting at WL0 and proceeding toward WL63.

However, other approaches are possible. For example, a back and forth programming order can be used such as: WL0, WL1, WL0, WL2, WL1, WL3, WL2, ..., where each word line is programmed in first and second programming passes. In one approach, the first programming pass for each word line programs the memory cells with lower page data and the second programming pass for each word line programs the memory cells with upper page data. In another approach, the first programming pass for each word line programs the memory cells partway toward their target data state, such as in a foggy programming pass, and the second programming pass for each word line programs the memory cells the rest of the way toward their target data state, such as in a fine programming. Foggy-fine programming is discussed further below.

In another approach, three programming passes are used. Regardless of the programming order, the down coupling techniques can be adjusted based on whether the memory cells of an adjacent word line are programmed, and the degree to which they are programmed. The amount by which a voltage can be drive down will be limited by the highest programmed Vth of the memory cells of an adjacent word line, to meet the condition of the memory cells of the adjacent word line being in a conductive state during sensing of the memory cells of the selected word line. This condition requires the pass voltage of the adjacent word line to be higher than the highest programmed Vth of the memory cells of the adjacent word line by a margin such as 1-2 V.

For a word line at the edge of a block, such as WL0 or WL63, there may only be one adjacent word line to provide down coupling. To address this, it is possible to designate the edge word lines as dummy word lines which do not store data. In this case, each non-dummy word line has two adjacent word lines.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the memory cell channel into the nitride, where they are trapped and stored in a limited region. This stored charge then changes the Vth of a portion of the channel of the memory cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 2B depicts a NOR configuration of a block BLK0a of flash memory cells in the memory array 155 of FIG. 1 and an associated sense block SB0. In the NOR configuration, the drain terminal of a set of cells is connected to a bit line while the source terminal of each cell is connected directly to a source line (SL), shown as a short-dashed line. Three example sets of NOR cells are provided, where the drain terminals of the memory cells in each set are connected to a sense block SB0 via respective bit line BL0, BL1 and BL2. The source terminals of the memory cells in all sets are connected to a common source line (SL). An example set S0 includes memory cells 211, 212, 213, . . . , 214 connected to word lines WL1, WL2, WL3, . . . , WL62, respectively. A well 210 in a substrate is also depicted.

FIG. 2C depicts an example flash memory cell 220, also referred to as a storage element. The memory cell is formed on a bulk region 228 of a substrate, having a voltage Vb, and includes an oxide (Ox) layer 224, a floating gate 223, an inter-poly dielectric (IPD) 222 and a control gate 221, which is part of a word line. A drain terminal 226 at a voltage Vd, and a source terminal 225 at a voltage Vs, are formed in the substrate. A channel region 227 having a voltage Vch may also be created in the substrate, as a conductive path between the drain and source terminals.

During sensing of the memory cell, the lowest Vth which can be sensed is Vcg−Vs (where Vs=Vsl), since Vcg−Vs−Vth=0 V. By reducing Vcg by down coupling, the lowest Vth which can be sensed is reduced.

Figure 3A:
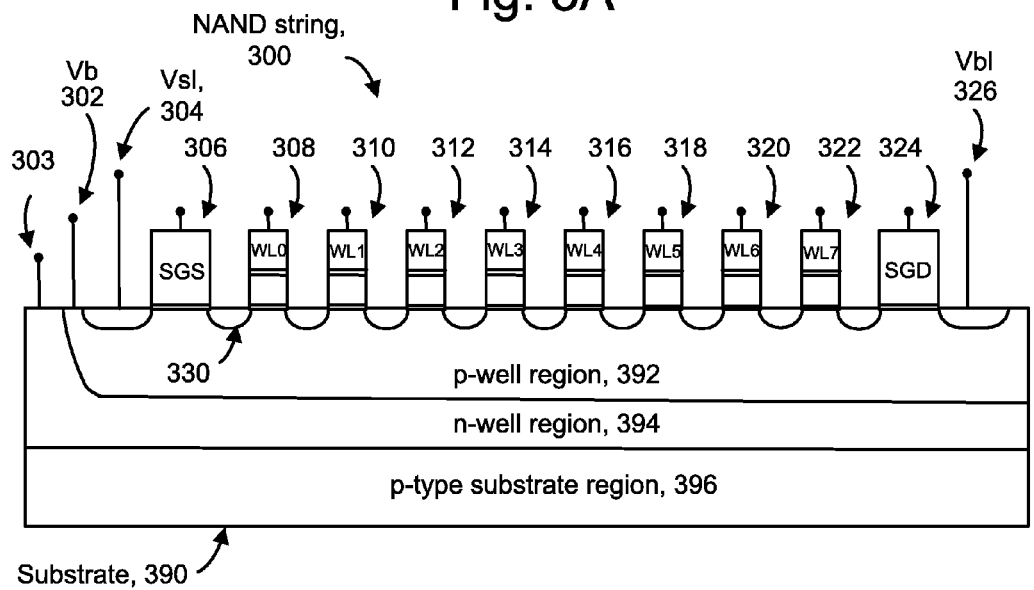
FIG. 3A depicts a cross-sectional view of the NAND string NS0 of FIG. 2A as formed on a substrate, in a triple-well configuration.

FIG. 3A depicts a cross-sectional view of the NAND string NS0 of FIG. 2A as formed on a substrate, in a triple-well configuration. The view is simplified and not to scale. Further, eight word lines instead of sixty-four are shown for simplicity. In this approach, the substrate 390 employs a triple-well technology which includes a p-well region 392 within an n-well region 394, which in turn is within a p-type substrate region 396 (as a third well). The source/drain regions are n-type.

The NAND string 300 includes a source-side select gate 306, a drain-side select gate 324, and eight memory cells 308, 310, 312, 314, 316, 318, 320 and 322, formed on a substrate 390. A number of source/drain regions, one example of which is source drain/region 330, are provided on either side of each storage element and the select gates 306 and 324. The NAND string and its non-volatile memory cells can be formed, at least in part, on the p-well region. A source supply line 304 with a potential of Vsl (sl=source line) is provided in addition to a bit line 326 with a potential of Vbl. In one possible approach, a body (or bulk) bias voltage, Vb, is applied to the p-well region 392 via a terminal 302. A voltage can also be applied to the n-well region 394 via a terminal 303.

Figure 3B:
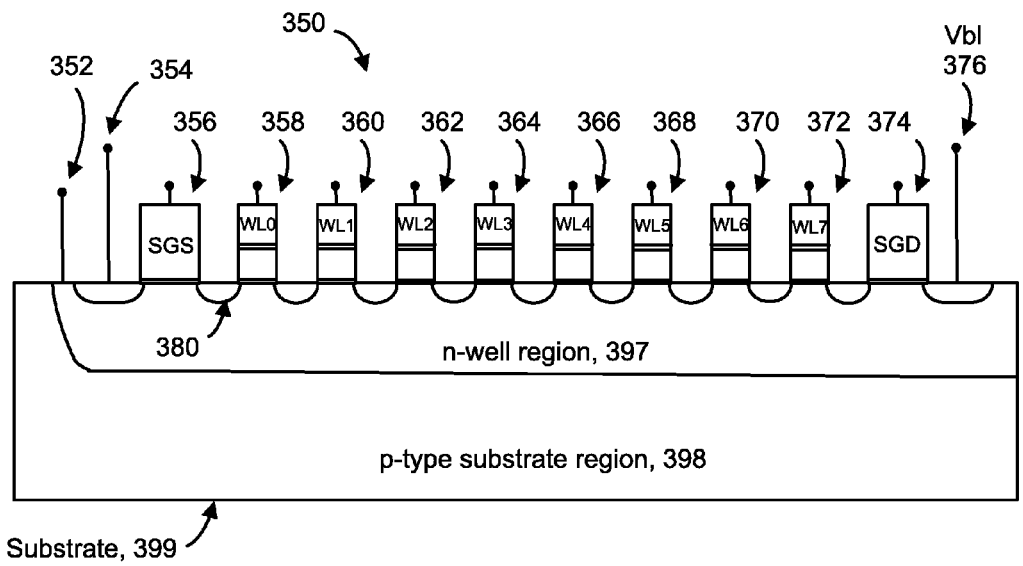
FIG. 3B depicts a cross-sectional view of the NAND string NS0 of FIG. 2A as formed on a substrate, in a double-well configuration.

FIG. 3B depicts a cross-sectional view of the NAND string NS0 of FIG. 2A as formed on a substrate, in a double-well configuration. In this approach, the substrate 399 employs a double-well technology which includes an n-well region 397 within the p-type substrate region 398 (as a second well). The source/drain regions are p-type. The NAND string 350 includes a source-side select gate 356, a drain-side select gate 374, and eight memory cells 358, 360, 362, 364, 366, 368, 370 and 372, formed on a substrate 399. An example source drain/region 380 is depicted. The NAND string and its non-volatile memory cells can be formed, at least in part, on the n-well region. A source supply line 354 with a potential of Vsl is provided in addition to a bit line 376 with a potential of Vbl. In one possible approach, Vb is applied to the n-well region via a terminal 352.

Reading of a nonvolatile memory cell is done by applying voltages to its terminals and measuring the current that flows through the memory cell. For NOR flash memory, the read of a cell can be done by comparing the current of the read cell to the current of a reference cell which is physically identical to the read cell and biased with the same voltages Vgs and Vds. For NAND flash memory, the read of a selected cell can be done by applying a read, program-verify or erase-verify voltage as Vcg to the selected cell, applying a pass voltage to unselected cells, pre-charging the bit line and observing a discharge of the bit line.

Figure 4:
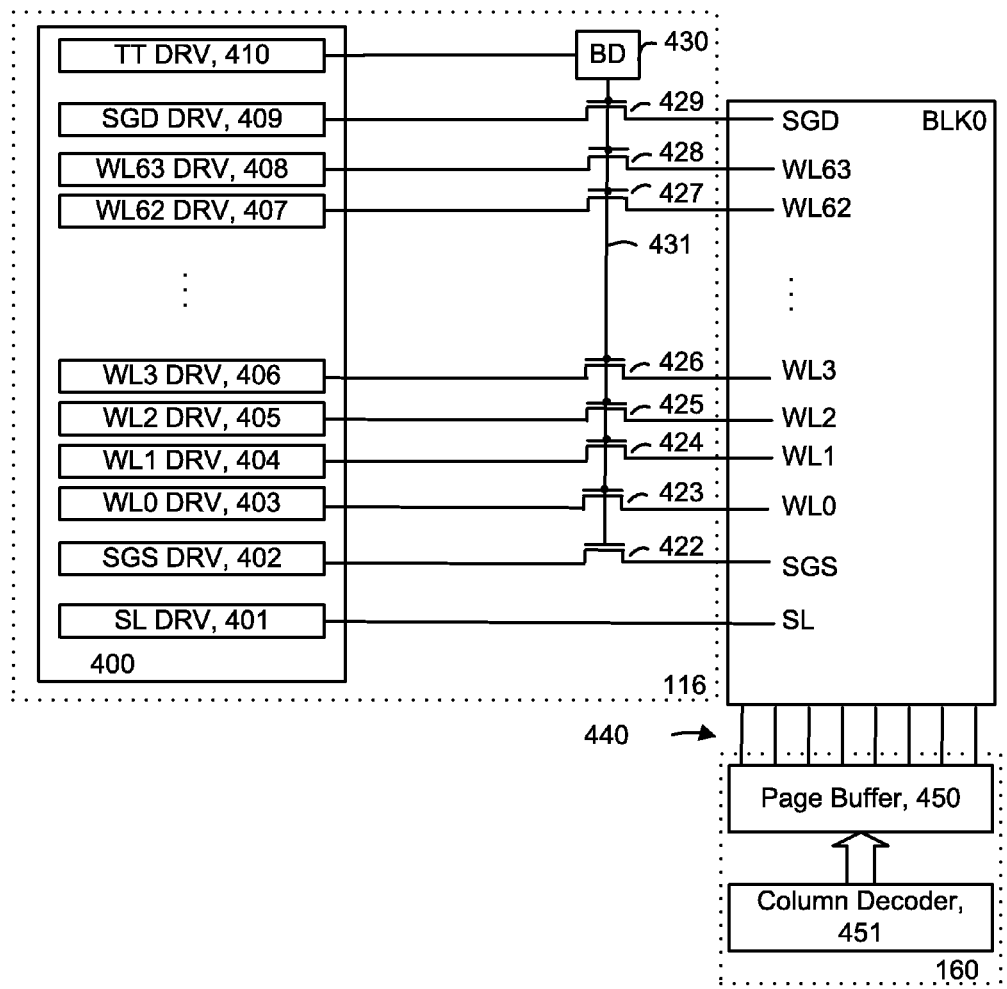
FIG. 4 depicts a configuration of the power control block 116 and column control circuitry 160 of FIG. 1.

FIG. 4 depicts a configuration of the power control block 116 and column control circuitry 160 of FIG. 1. The power control block 116 includes a set of drivers 400 which provide voltages to word lines and other control lines in one or more blocks of memory cells, such as BLK0.

A source line (SL) driver (DRV) 401 provides a voltage (Vsl) on a source line which is common to different blocks. An SGS driver 402 provides a voltage (Vsgs) on an SGS line of one or more blocks, via a transfer transistor (TT) 422. This voltage is a control gate voltage of the source-side select transistors. A WLDS driver 403 provides a voltage on a WLDS line of one or more blocks, via TT 423.

A WL0 driver 403 provides a voltage on WL0 of one or more blocks, via TT 423. A WL1 driver 404 provides a voltage on WL1 of one or more blocks, via TT 424.

A WL2 driver 405 provides a voltage on WL2 of one or more blocks, via TT 425. A WL3 driver 406 provides a voltage on WL3 of one or more blocks, via TT 426.

A WL62 driver 407 provides a voltage on WL62 of one or more blocks, via TT 427. A WL63 driver 408 provides a voltage on WL63 of one or more blocks, via TT 428. An SGD driver 409 provides a voltage on an SGD line of one or more blocks, via TT 429. A TT driver 410 provides a voltage to a block decoder (BD) 430.

The BD is addressed, via a separate path, not shown, when BLK0 is selected. The BD acts as a conductive switch which passes the voltage form the TT DRV to the control gates of the associated transfer transistors via path 431. Each transfer transistor may be an nMOSFET, for example, which has a drain node on the left hand side and a source node on the right hand side. The drain node for each transfer transistor is connected to a respective voltage driver in the set of high-voltage voltage drivers. Each driver may include an on-chip charge pump.

A number of bit lines (BLs) 440 extend across BLK and into a page buffer 450, which is responsive to a column decoder 451. The page buffer stores data which is written into, or read from, the selected block.

Each driver can directly drive its respective control line via a transfer transistor. The path 431 can be provided at a voltage which is sufficiently high to provide the transfer transistors in a conductive state to pass any expected driven voltage from the drivers. The drivers also have the ability to float a voltage on a control line. As mentioned, the voltage on a word line being sensed (a selected word line) may be down coupled based on capacitive coupling from one or more adjacent word lines. The down coupled level can be a positive or negative voltage, for instance. In the case of a negative voltage, the down coupled level may be limited to the junction diode voltage of the transfer transistor, due to a leakage current of the transfer transistor.

The leakage current is caused by the negative voltage on the word line which results in a forward biased junction on the transfer transistor. The transfer transistor can be designed to allow a larger magnitude of a negative voltage such as by doping the transistor to reduce the junction leakage current.

FIG. 5 is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of memory cells.

A sense module comprises sense circuitry 170 that performs sensing by determining whether a conduction current in a connected bit line is above or below a predetermined threshold level. The sense circuitry 170 can have a current source 171 which applies a current to a selected NAND string to evaluate whether the NAND string is defective, as discussed further below. A sense module also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 allows programming.

Managing circuit MC0 comprises a processor 192, four example sets of data latches 194, 195, 196 and 197 and an I/O Interface 196 coupled between the set of data latches 194 and data bus 120. Data latches identified by LDL, UDL, DL1 and DL2 may be provided for each set. Each set is used by cells of an associated bit line. For example, sets 194-197 can be used for cells of BL0-BL3, respectively. In some cases, additional data latches may be used. LDL stores a bit for a lower page of data, and UDL stores a bit for an upper page of data. This is in a four-level or two-bits per memory cell memory device. One additional data latch per bit line can be provided for each additional data bit per memory cell. DL1 and DL2 can be used to store a bit which indicates whether the associated memory cell is fast or slow programming. In some cases, the number of extra data latches is the same as the number of phases in a multi-phase programming operation, while in other cases, the number of extra data latches is less than the number of phases in a multi-phase programming operation.

Processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per memory cell implementation. In a three-bit per memory cell implementation, two upper data latches, UDL1 and UDL2, may be used. The programming operation, under the control of the state machine, comprises a series of programming voltage pulses applied to the control gates of the addressed memory cells. Each program pulse is followed by a read back (verify) to determine if the memory cell has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated memory cell has reached certain mileposts in a programming operations. For example, latches may identify that the Vth of a memory cell is below a particular verify level. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. The UDL latches can be used to store an upper page of data, for instance. A UDL latch is flipped when an upper page bit is stored in an associated memory cell. The flipping of a bit occurs when an associated memory cell completes programming, e.g., when its Vth exceeds a target verify level such as VvA, VvB or VvC. When UDL1 and UDL2 are used, UDL1 is flipped when a lower, upper bit is stored in an associated memory cell, and UDL2 is flipped when an upper, upper bit is stored in an associated memory cell. The lower, upper bit can also be referred to as the middle page bit. For example, in FIG. 10A-10D, the second bit is the lower, upper bit and the third bit is the upper, upper bit.

Figure 6A:
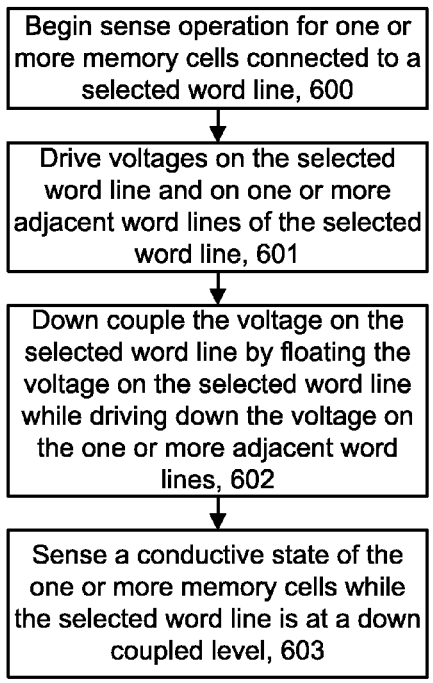
FIG. 6A depicts a sense operation in which a voltage of a selected word line is down coupled by one or more adjacent word lines.

FIG. 6A depicts a sense operation in which a voltage of a selected word line is down coupled by one or more adjacent word lines. Step 600 begins a sense operation for one or more memory cells connected to a selected word line. For example, if WL2 is a selected word line in FIG. 2A, memory cell 202 is connected to the selected word line. Step 601 drives voltages on the selected word line and on one or more adjacent word lines of the selected word line. For example, WL1 is a source-side adjacent word line of WL2, and WL3 is a drain-side adjacent word line of WL2. Step 602 down couples the voltage on the selected word line by floating the voltage on the selected word line while driving down the voltage on the one or more adjacent word lines. See, e.g., FIG. 7A-7C for further details. Step 603 senses a conductive state of the one or more memory cells while the selected word line is at a down coupled level. The down coupled level can be a desired level, e.g., for read, program-verify or erase-verify.

Figure 6B:
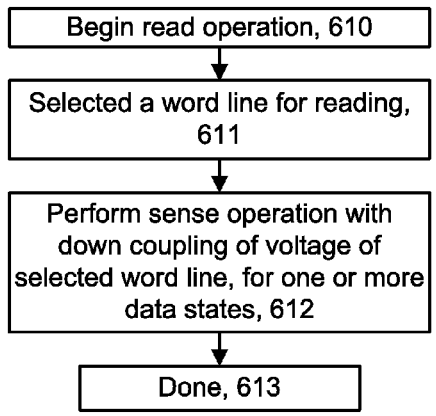
FIG. 6B depicts an example of a read operation which uses the sense operation of FIG. 6A.

FIG. 6B depicts an example of a read operation which uses the sense operation of FIG. 6A. Step 610 begins a read operation. For example, this can occur in response to a read command received by the memory device from a host. Or, the memory device can initiate a read itself, such as to move data between blocks. Step 611 selects a word line for reading. Additionally, one or more groups of memory cells connected to the word line can be selected. Data can be read in a unit of a page, which can involve all, or a subset, of the memory cells connected to a word line. Step 612 perform a sense operation with down coupling of the voltage of the selected word line, for one or more data states. For example, in the four-state example of FIG. 8B, a read operation can be made using a word line voltage of VrB to read a lower page bit, using a word line voltage of VrA to distinguish an upper page bit when the lower page bit=1, and using a word line voltage of VrC to distinguish an upper page bit when the lower page bit=0. See also FIG. 12A. The read is done at step 613.

Figure 6C:
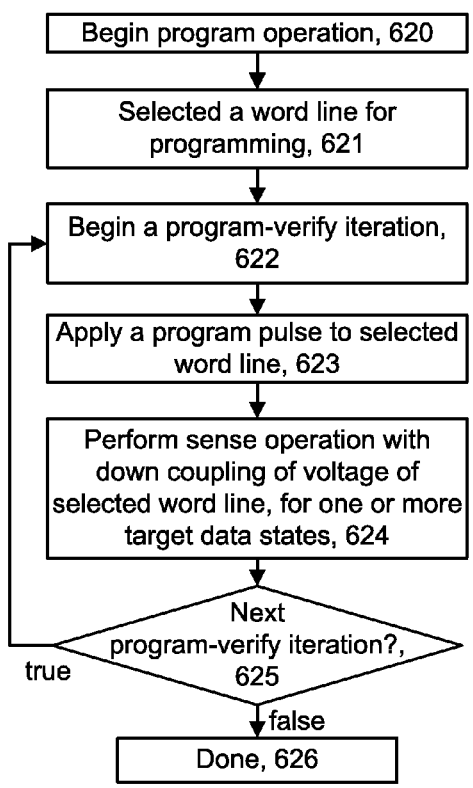
FIG. 6C depicts an example of a program operation which uses the sense operation of FIG. 6A.

FIG. 6C depicts an example of a program operation which uses the sense operation of FIG. 6A. Step 620 begins a program operation. For example, this can occur in response to a program command received by the memory device from a host. Or, the memory device can initiate programming itself, such as to move data between blocks. Step 621 selects a word line for programming. Additionally, one or more groups of memory cells connected to the word line can be selected. Data can be programmed in a unit of a page. Step 622 begins a program-verify iteration. Step 623 applies a program pulse to the selected word line. For example, see FIG. 12B. Step 624 perform a sense operation with down coupling of the voltage of the selected word line, for one or more target data states. For example, in the four-state example of FIG. 8B, a program-verify operation can be made using word line voltages of VvA, VvB and VvC for verifying cells having the A, B or C target data states, respectively. Decision step 625 determines if a next program-verify iteration is to be performed. If decision step 625 is true, a next program-verify iteration begins at step 622. If decision step 625 is false, the programming is done at step 626.

Figure 6D:
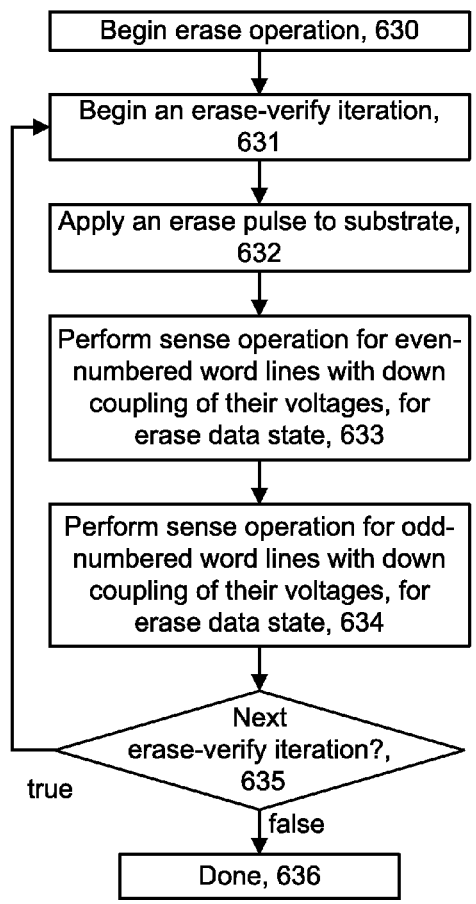
FIG. 6D depicts an example of an erase operation which uses the sense operation of FIG. 6A.

FIG. 6D depicts an example of an erase operation which uses the sense operation of FIG. 6A. Step 630 begins an erase operation. For example, this can occur in response to an erase command received by the memory device from a host. Or, the memory device can initiate an erase. in one approach, an erase operation erases a block of memory cells concurrently so no word lines are selected to be erased. Step 631 begins an erase-verify iteration. Step 632 applies an erase pulse to the substrate, e.g., to the p-well in a triple-well substrate or to the n-well in a double-well substrate. For example, see FIG. 12C. In this example, down coupling of multiple word lines can occur concurrently by alternately verifying memory cells of the even-numbered word line and the odd-numbered word lines.

For example, step 633 performs a sense operation for even-numbered word lines with down coupling of their voltages (due to driving down voltages of the odd-numbered word lines), for the erased data state. An erase-verify operation can be made using a word line voltage of VvEr. See FIG. 12C. Subsequently, step 634 performs a sense operation for odd-numbered word lines with down coupling of their voltages (due to driving down voltages of the even-numbered word lines), for the erased data state. Alternatively, steps 633 and 634 can be reversed. Decision step 635 determines if a next erase-verify iteration is to be performed. If decision step 635 is true, a next erase-verify iteration begins at step 631. If decision step 635 is false, the erasing is done at step 636.

Figure 7A:
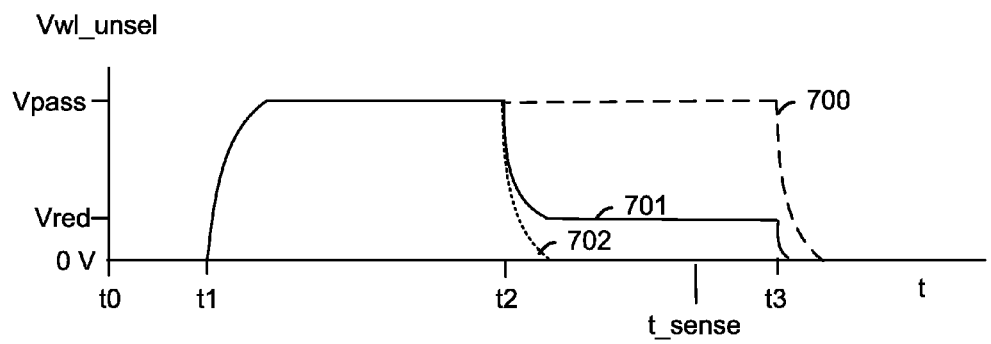
FIG. 7A depicts example waveforms of unselected word lines for implementing the sense operation of FIG. 6A.
Figure 7B:
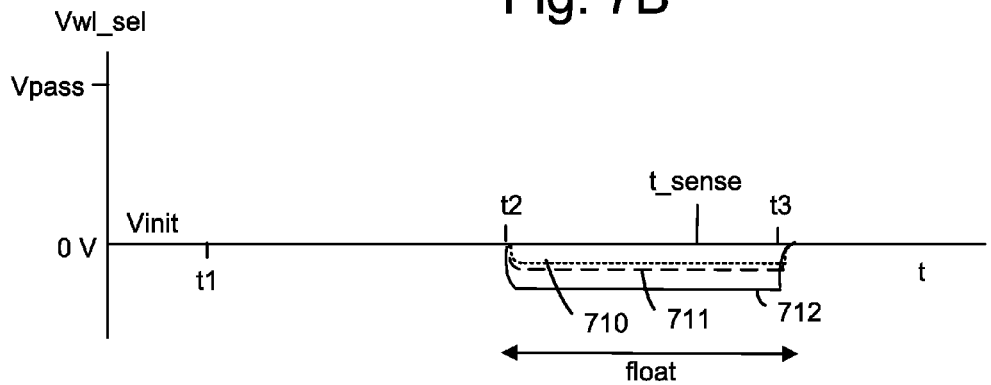
FIG. 7B depicts example waveforms of a selected word line which is down coupled from 0 V in the sense operation of FIG. 6A, consistent with FIG. 7A.
Figure 7C:
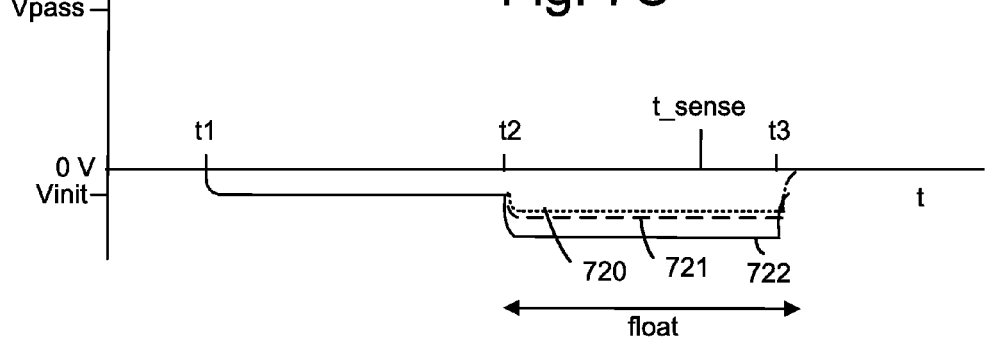
FIG. 7C depicts example waveforms of a selected word line which is down coupled from a negative voltage in the sense operation of FIG. 6A, consistent with FIG. 7A.

FIG. 7A depicts example waveforms of unselected word lines for implementing the sense operation of FIG. 6A. In FIG. 7A-7C, the horizontal axis represents time and the vertical axis represents voltage (Vwl_unsel for an unselected word line and Vwl_sel for a selected word line). FIG. 7A-7C are time-aligned. Time t0 represents the start of a sensing operation. In one approach, the voltages on the unselected waveforms are driven (not floated). Three waveforms are depicted. Waveform 700 is used for non-adjacent word lines of a selected word line. For the example, where WL2 is the selected word line, the remaining, non-adjacent word lines are WL0 and WL4-WL63. Waveform 700 is at a pass voltage (Vpass) level. In some cases, different non-adjacent word lines have different voltages. For example, one or more non-adjacent word lines can have an isolation voltage which is 0 V or close to 0 V.

Generally, one or more remaining word lines (e.g., WL0 and WL4-WL63) of the plurality of word lines, other than the one or more adjacent word lines (WL1 and WL3), have a fixed voltage (e.g., Vpass) during the floating of the selected word line and do not down couple the selected word line.

Waveform 701 is used for an adjacent word line (e.g., WL1) which is connected to programmed memory cells. Waveform 702 is used for an adjacent word line (e.g., WL3) which is connected to erased or less programmed (less than WL1) memory cells. This example assumes the sensing occurs during a program-verify test of a program operation in which cells of WL0 are programmed first, followed by cells of the subsequent word lines, proceeding toward the last word line, WL63. In this case, when WL2 is being programmed, the memory cells of WL1 have been programmed but the memory cells of WL3 have not yet been programmed and therefore contain only erased memory cells. Thus, WL1, on the source-side of WL2 is a programmed adjacent word line, and WL3, on the drain-side of WL2 is an erased adjacent word line.

The voltages of the unselected word line are driven higher at t1. In this example, they are driven higher to a common level, Vpass, but this is not required. Further, they are driven higher at a common time, but this also is not required. Further, the voltages may already be at an elevated level, in which case they continue to be driven at that level without necessarily being driven higher. At t2, one or both of the adjacent word lines are driven lower to down coupled the voltage of the selected word line. This driving can occur in one or more steps or in a ramp, for instance. Further, when both adjacent unselected word lines are driven lower, the driving lower can occur at the same time or at different times. In a first example, Vpass=6 V, the programmed adjacent word line (waveform 701) is driven down to a reduced, non-zero level (Vred) such as 2 V and the erased adjacent word line (waveform 702) is driven down to 0 V. This may occur when down coupling from both adjacent word lines is desired. In a second example, the erased adjacent word line is driven down as indicated by waveform 702, but the programmed adjacent word line is not driven down as indicated by waveform 700. This may occur when down coupling from the erased adjacent word line is sufficient. In a third example, the programmed adjacent word line is driven down as indicated by waveform 701, but the erased adjacent word line is not driven down as indicated by waveform 700. This may occur when down coupling from the programmed adjacent word line is sufficient.

The down coupling occurs just after t2 and is done in preparation for performing the sensing operation at t_sense. The process is completed at t3.

It may be desirable to provide down coupling only from an erased word line rather than from a program word line due to a potential for a disturb of the programmed word line when a high voltage is applied. To avoid or reduce any disturb, if down coupling from both erased and programmed word lines is used, the peak voltage on the programmed word line may be lower than on the erased word line.

FIG. 7B depicts example waveforms of a selected word line which is down coupled from 0 V in the sense operation of FIG. 6A, consistent with FIG. 7A. The selected word line is initially driven at 0 V (Vinit), from t1-t2. At t2, or shortly sooner, the voltage of the selected word line is floated so that it can be down coupled by the one or more adjacent word lines. In the first example mentioned above, the down coupled level is a lowest level of the three examples (waveform 712). In the second example mentioned above, the down coupled level is the intermediate level of the three examples (waveform 711). In the third example mentioned above, the down coupled level is the highest level of the three examples (waveform 710).

The change in the voltage of the selected word line is based on the decrease in the voltage of the adjacent word line multiplied by a coupling ratio (CR). Assuming CR=25%, the down coupling amount is 25%×((6−2)+(6−0))=2.5 V in the first example. Since the initial level is 0 V, the down coupled level is 0-2.5=−2.5 V. In the second example, the down coupling amount is 25%×((6−0))=1.25 V, and the down coupled level is 0-1.25=−1.25 V. In the third example, the down coupling amount is 25%×((6−2))=1 V, and the down coupled level is 0-1=−1 V. The amount of down coupling can be adjusted as desired by adjusting the magnitude of the decrease in the voltage of a first adjacent word line. If additional down coupling is desired, a second adjacent word line can be used.

In practice, there can be a slight delay in the decrease of the voltage of the memory cells along selected word line relative to the decrease in the voltage of the adjacent word line based on the position of the memory cells along the word line. This is due to an RC delay. This can be addressed by waiting a sufficient amount of time to allow the down coupling to reach all cells along the length of the selected word line.

FIG. 7C depicts example waveforms of a selected word line which is down coupled from a negative voltage in the sense operation of FIG. 6A, consistent with FIG. 7A. In this case, the memory device has the capability to drive the selected word line at a negative level (Vint) but an even lower negative voltage may be desired which cannot be provided by the word line driver. The selected word line is initially driven at Vint<0 V, from t1-t2. At t2, or shortly sooner, the voltage of the selected word line is floated. In the first example mentioned above, the down coupled level is a lowest level of the three examples (waveform 722). In the second example mentioned above, the down coupled level is the intermediate level of the three examples (waveform 721). In the third example mentioned above, the down coupled level is the highest level of the three examples (waveform 720).

As mentioned, the down coupling amounts are 2.5, 1.25 and 1 V in the first, second and third examples, respectively. Assuming the initial level is −1 V, the down coupled levels are −3.5, −2.25 and −2 V in the first, second and third examples, respectively.

In another possible case, the voltage of the word line is initially at a positive level (Vinit>0 V) and can be down coupled to a lower positive level, 0 V or a negative level.

Various options include: (a) the driven level of an adjacent word line is a non-negative voltage and the down coupled level is a negative or non-negative voltage, and (b) the driven level of an adjacent word line is a negative voltage and the down coupled level is a negative or non-negative voltage.

In one approach, the one or more adjacent word lines comprise an erased word line (e.g., WL3) which is after the selected word line (e.g., WL2) in a programming order of a plurality of word lines, where the erased word line is connected to erased memory cells (e.g., 203) and is not connected to programmed memory cells, and a programmed adjacent word line (e.g., WL1) which is before the selected word line in the programming order of the plurality of word lines and is connected to programmed memory cells (e.g., 201). The down coupling reduces voltages of the erased and programmed word lines to different respective minimum levels (e.g., 0 V and Vred, respectively), where respective minimum level of the programmed adjacent word line (Vred) is greater than the respective minimum level of the erased adjacent word line (0 V). Further, the respective minimum level of the programmed adjacent word line is sufficiently high to provide the programmed memory cells in a conductive state during the sensing operation, and the respective minimum level of the erased adjacent word line is sufficiently high to provide the erased memory cells in a conductive state during the sensing operation.

Moreover, an amount of down coupling from the erased adjacent word line (e.g., CR×(Vpass−0 V)) can be more than an amount of down coupling from the programmed adjacent word line (e.g., Cr×(Vpass−Vred)).

FIGS. 8A and 8B depict Vth distributions in a single pass programming operation which uses four data states. FIG. 8A depicts an erased (Er) state Vth distribution 800, and FIG. 8B depicts Vth distributions 800, 804, 806 and 808 after programming following the Vth distribution of FIG. 8A.

One pass programming, also referred to as "one-pass write" programming, involves a sequence of multiple program-verify operations which are performed starting from an initial program voltage (Vpgm) and proceeding to a final Vpgm until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 700 is provided for erased (Er) state memory cells. Three Vth distributions 804, 806 and 808 represent target data states A, B and C, respectively, which are reached by memory cells when their Vth exceeds a final verify level VvA, VvB or VvC, respectively, of the target data state.

A program option which uses a slow programming mode be referred to as a "quick pass write" (QPW) technique. QPW can be used independently in one or more passes of a multiple pass programming technique. Although, generally, it is sufficient to use QPW in the final programming pass when accuracy is most important.

When QPW is used, lower, QPW verify levels (VvAL, VvBL or VvCL) are defined such that the memory cells enter a slow programming mode (e.g., by raising the associated bit line voltages applied during a program pulse to a level such as 0.5-1 V) when their Vth is between the QPW verify level and the final verify level of a respective target data state. The QPW verify levels are offset below the respective final verify levels, in one implementation. Subsequently, when a verify test determines that the Vth of a memory cell exceeds the final verify level, the memory cell is inhibited from further programming (e.g., by raising the associated bit line voltages applied during a program pulse to a level such as 2-3 V).

In some cases, QPW is used on fewer than all target data states. For example, a wider Vth distribution may be acceptable for the highest data state (e.g., the C-state) so that the QPW can be used for states other than the C-state, such as the A or B-state. Total programming time may be reduced by avoiding the use of QPW with the highest data state, since the time spent in sensing whether the Vth exceeds VvCL can be avoided.

Read reference voltages VrA, VrB and VrC which are between the Vth distributions are used for reading data from the memory cells. By testing whether the Vth of a given memory cell is above or below one or more of the read reference voltages, the system can determine the data state which is represented by a memory cell.

In some case, one or more of the lowest read or verify voltages (e.g., VrA, VvA_foggy, VvAL, VvA or VvLM) can be negative, so that down coupling is useful to provide these voltages on a selected word line when the word line drivers cannot provide a negative voltage, or a sufficiently low negative voltage. The use of negative read and verify voltages is expected to increase as the number of data states increases and the data states are moved closer together.

FIG. 8C depicts Vth distributions after programming using foggy verify levels following the Vth distribution of FIG. 8A. One type of multi-pass programming is referred to as foggy-fine programming. The term "foggy" indicates that the memory cells are programmed to a relatively wide Vth distribution, and the term "fine" indicates that the memory cells are programmed to a relatively narrow Vth distribution. In one implementation, the A-state, B-state and C-state memory cells are programmed from the E-state distribution 800 to the distributions 810, 812 and 814, respectively, using foggy verify levels VvA_foggy, VvB_foggy and VvC_foggy, respectively. This is the foggy programming pass, which is typically the next-to-last pass of a multi-pass programming operation. In a two pass programming operation, the foggy programming pass can be the first pass and a fine programming pass (which results in the distribution of FIG. 8B) can be the second pass.

A relatively large program pulse step size may be used, for instance, to quickly program the memory cells to the respective verify levels. Wider Vth distributions may be achieved compared to the case of FIG. 8B. If QPW is not used in the fine programming pass, the foggy verify levels could be the same as, or different than, the lower, QPW verify levels. If QPW is used in the fine programming pass, the foggy verify levels should be lower than the QPW verify levels so that QPW technique can be effective in the fine programming pass.

FIGS. 9A-C depict programming of lower and upper pages in two-bit, four-level memory cells. Each graph depicts Vth on the horizontal axis and a number or population of memory cells in a Vth distribution on the vertical axis. In this case, each memory cell can store two bits of data in one of four possible Vth ranges, referred to as states Er, A, B and C. Moreover, the bits are classified into lower and upper page data. Thus, a first bit of each memory cell forms a lower page of data, and a second bit of each memory cell forms an upper page of data.

Programming can be performed one logical page at a time, with the lower page followed by the upper page. Initially, all memory cells are in the erased (Er) state, represented by the distribution 900 in FIG. 9A.

FIG. 9B depicts programming of a lower page of data. If the lower page has a bit=1, the associated memory cell remains in the distribution 900, and the data is represented by x1, where x is an upper page bit that is not yet known. If the lower page has a bit=0, the memory cell is programmed to a higher Vth as represented by distribution 902, which is a first interim distribution (INT), using a verify level Vv1. The data of these memory cells is represented by x0. Note that the interim distribution can be relatively wide since it is not a final distribution and does not represent a final data state.

FIG. 9C depicts programming of an upper page of data. If the upper page has a bit=1, and the lower page has a bit=1, the associated memory cell in the distribution 900 remains in the distribution 900 and stores data bits 11. If the upper page has a bit=0, and the lower page has a bit=1, the associated memory cells in the distribution 900 are programmed to the distribution 904 using the verify level of VvA. If the upper page has a bit=1, and the lower page has a bit=0, the associated memory cells in the distribution 902 are programmed to the distribution 908 using the verify level VvC. If the upper page has a bit=0, and the lower page has a bit=0, the associated memory cells in the distribution 902 are programmed to the distribution 906 using the verify level VvB. Read voltages VrA, VrB and VrC are also depicted.

Programming can be similarly extended to three or more bits per memory cell. For example, FIGS. 10A-D depict programming of lower, middle and upper pages in three-bit, eight-level memory cells. Initially, all memory cells are in the erased (Er) state, represented by the distribution 1000 in FIG. 10A. The lower page is programmed in FIG. 10B. If the lower page is bit=1, memory cells in distribution 1000 remain in that distribution. If the lower page is bit=0, memory cells in distribution 1000 are programmed to an interim distribution 1002 using verify level Vv1. The middle page is programmed in FIG. 10B. If the middle page is bit=1, memory cells in distribution 1000 remain in that distribution, and memory cells in distribution 1002 are programmed to interim distribution 1008 using verify level Vv4. If the middle page is bit=0, memory cells in distribution 1000 are programmed to interim distribution 1004 using verify level Vv2, and memory cells in distribution 1002 are programmed to interim distribution 1006 using verify level Vv3.

The upper page is programmed in FIG. 10C. If the upper page is bit=1, memory cells in distribution 1000 remain in that distribution, memory cells in distribution 1004 are programmed to distribution 1014 (state C) using verify level Vvc, memory cells in distribution 1006 are programmed to distribution 1016 (state D) using verify level Vvd, and memory cells in distribution 1008 are programmed to distribution 1022 (state G) using verify level Vvg. If the upper page is bit=0, memory cells in distribution 1000 are programmed to distribution 1010 (state A) using verify level VvA, memory cells in distribution 1004 are programmed to distribution 1012 (state B) using verify level VvB, memory cells in distribution 1006 are programmed to distribution 1018 (state E) using verify level VvE, and memory cells in distribution 1008 are programmed to distribution 1020 (state F) using verify level VvF. Read voltages VrA, VrB, VrC, VrD, VrE, VrF and VrG are also depicted.

Programming using four bits per cell (16 levels) can similarly involve lower, lower-middle, upper-middle and upper pages.

FIG. 11 depicts example threshold voltage distributions of an erased state and higher data states for a set of non-volatile memory cells. The x-axis indicates a Vth and the y-axis indicates a number of memory cells. In this example, there are four data states: an erased (E) state 1142, an A state 1144, a B state 1146 and a C state 1148. Memory devices with additional data states, e.g., eight or sixteen data states, or fewer states, e.g., two states, can also be used. An erase sequence can include an erase operation and an optional soft programming operation. The distribution 1140 is realized after the erase operation when memory cells are typically over-erased, past the erase state 1142. An erase operation can include successive erase-verify iterations (see FIG. 12C). Each erase-verify iteration includes an erase iteration comprising an erase pulse followed by a verify iteration comprising a verify pulse and sensing operation. Erase pulses are applied to the substrate until the Vth of the memory cells being erased transitions below an erase verify level, Vv_Er.

Once the erase operation is completed, the soft programming operation can optionally be performed, in which a number of positive voltage pulses are applied to the control gates of the memory cells, such as via a word line, to increase the threshold voltages of some or all of the memory cells in the distribution 1140 closer to and below a soft programming verify level, Vv_sp, to the erased state 1142. The soft programming operation advantageously results in a narrow erase state distribution 1142. Once the soft programming operation is complete, programming to higher data states can occur, such as to states A, B and C using verify levels Vv_A, Vv_B and Vv_C, respectively.

Typically, Vv_sp and Vv_Er are negative, so that down coupling is useful to provide these voltages on a selected word line when the word line drivers cannot provide a negative voltage, or a sufficiently low negative voltage.

Figure 12A:
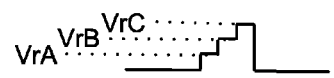
FIG. 12A depicts an example waveform for use in the read operation of FIG. 6B.

FIG. 12A depicts an example waveform for use in the read operation of FIG. 6B. The horizontal direction represents time and the vertical direction represents voltage. The waveform is applied to the selected word lines and includes pulses at VrA, VrB and VrC, as an example in a four-state memory device.

Figure 12B:
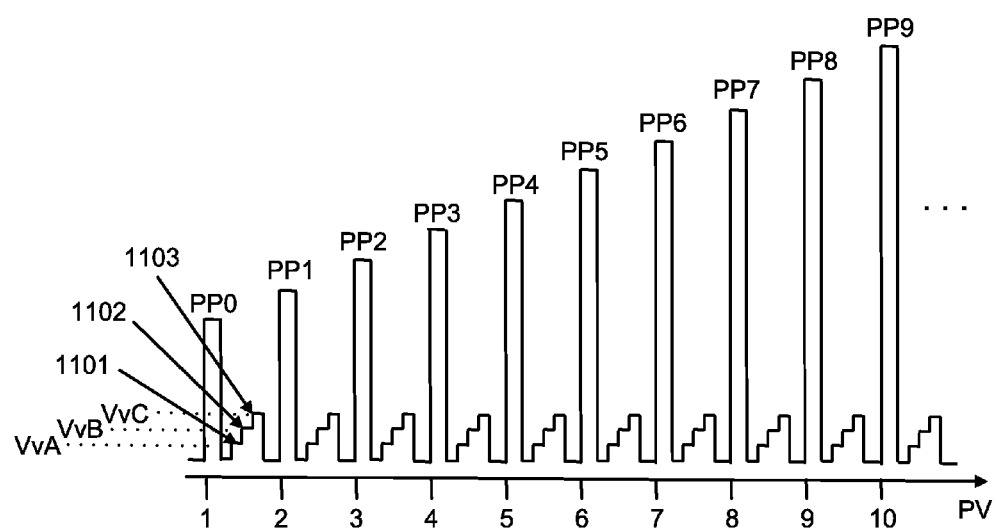
FIG. 12B depicts an example waveform for use in the program operation of FIG. 6C.

FIG. 12B depicts an example waveform for use in the program operation of FIG. 6C. The horizontal direction represents time and a number of program-verify iterations (PV) and the vertical direction represents voltage. The waveform includes program pulses PP0-PP9 and verify pulses of magnitude VvA, VvB and VvC. In some cases, the verify pulses are tailored to the programming progress such that A-state verify pulses are used for some of the earlier program-verify iterations, then the A- and B-state verify pulses are used, then the B- and C-state verify pulses are used, and finally the C-state verify pulses are used for some of the later program-verify iterations. Verify pulses 1101, 1102 and 1103 are examples of verify pulses at VvA, VvB and VvC, respectively.

Figure 12C:
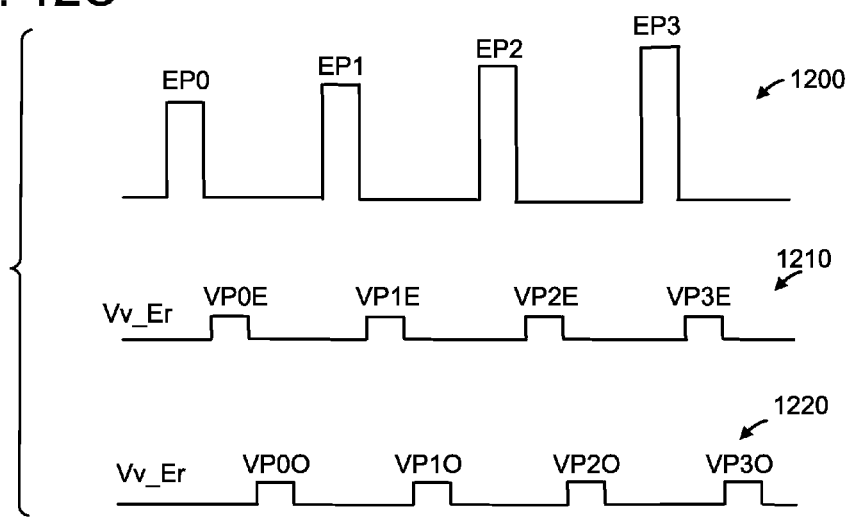
FIG. 12C depicts an example waveforms for use in the erase operation of FIG. 6D.

FIG. 12C depicts an example waveforms for use in the erase operation of FIG. 6D. Waveforms 1200, 1210 and 1220 are time-aligned. Waveform 1200 includes erase pulses EP0, EP1, EP2 and EP3. Waveform 1210 includes erase-verify pulses VP0E, VP1E, VP2E and VP3E having magnitude Vv_Er. Waveform 1220 includes erase-verify pulses VP0O, VP1O, VP2O and VP3O having magnitude Vv_Er.

Generally, an erase operation can be performed for a block of memory cells by applying one or more erase pulses, e.g., EP0-EP3 (waveform 1200) to the well of a substrate on which the block is formed. After the first erase pulse EP0, the amplitude of each erase pulse can be stepped up from the previous erase pulse by a step size. In one approach, after each erase pulse is applied, the memory cells of the even-numbered word lines are verified using down coupling from the memory cells of the odd-numbered word lines, then the memory cells of the odd-numbered word lines are verified using down coupling from the memory cells of the even-numbered word lines, or vice-versa. For example, a first erase-verify iteration uses the pulses EP0, VP0E and VP0O. In this example, it is assumed that the erase operation ends successfully after the verify tests associated with VP3E and VP3O are passed.

Accordingly, it can be seen that, in one embodiment, a method for sensing in a memory device (190) comprises: driving a selected word line (WL2) of a plurality of word lines (WL0-WL63) at a driven level (Vinit, Vwl_sel), each word line of the plurality of word lines is connected to a respective memory cells (201-203) in a set of memory cells (155); down coupling the selected word line to a down coupled level (710-712, 720-722), below the driven level, the down coupling comprises floating a voltage of the selected word line while decreasing a voltage (Vwl_unsel) of one or more adjacent word lines (WL1, WL3) of the selected word line; and while the voltage of the selected word line is floating and at the down coupled level, performing a sensing operation which involves the selected word line.

In another embodiment, a non-volatile storage apparatus (190) comprises: a set of memory cells (155); a plurality of word lines (WL0-WL63), each word line of the plurality of word lines is connected to respective memory cells (201-203) in the set of memory cells, the plurality of word lines comprises a selected word line (WL2) and one or more adjacent word lines (WL1, WL3) of the selected word line; a set of word line drivers (WL0 DRV-WL63 DRV) comprising a word line driver (WL2 DRV) connected to the selected word line, and one or more word line drivers (WL1 DRV, WL3 DRV) connected to one or more adjacent word lines; sensing circuitry (SB0-SB2, SM0-SM2, 100) associated with the set of memory cells; and a control circuit (110, 112, 114, 116, 150, 160, 165) associated with the set of word line drivers and the sensing circuitry. The control circuit: causes the word line driver connected to the selected word line to drive the selected word line at a driven level (Vinit, Vwl_sel), to down couple the selected word line to a down coupled level (710-712, 720-722), below the driven level, causes the word line driver connected to the selected word line to float a voltage (Vwl_sel) of the selected word line while causing the one or more word line drivers connected to the one or more adjacent word lines to decrease a voltage (Vwl_unsel) of the one or more adjacent word lines, and while the voltage of the selected word line floats and is at the down coupled level, cause the sensing circuitry to perform a sensing operation which involves the selected word line.

In another embodiment, a method for sensing in a memory device (100) comprises: in response to a command to perform a sensing operation involving a selected word line (WL2) of a plurality of word lines, providing a voltage (Vwl_sel) on the selected word line by initially driving the selected word line at a driven level (Vinit, Vwl_sel) and subsequently down coupling the selected word line to a down coupled level (710-712, 720-722), below the driven level; and while the voltage of the selected word line is floating and at the down coupled level, sensing a state of a memory cell connected to the selected word line.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for sensing in a memory device, comprising:
   driving a selected word line of a plurality of word lines at a driven level, each word line of the plurality of word lines is connected to a respective memory cells in a set of memory cells;
   down coupling the selected word line to a down coupled level, below the driven level, the down coupling comprises floating a voltage of the selected word line while decreasing a voltage of one or more adjacent word lines of the selected word line; and
   while the voltage of the selected word line is floating and at the down coupled level, performing a sensing operation which involves the selected word line.

2. The method of claim 1, further comprising:
   during the driving of the selected word line at the driven level, increasing the voltage of the one or more adjacent word lines.

3. The method of claim 1, wherein:
   the driven level is a non-negative voltage; and
   the down coupled level is a negative voltage.

4. The method of claim 1, wherein:
   the driven level is a non-negative voltage; and
   the down coupled level is a non-negative voltage.

5. The method of claim 1, wherein:
   the driven level is a negative voltage; and
   the down coupled level is a negative voltage.

6. The method of claim 1, wherein:
   the voltage of the one or more adjacent word lines is decreased no further than a level which is sufficiently high to provide memory cells which are connected to the one or more adjacent word lines in a conductive state during the sensing operation.

7. The method of claim 1, wherein:
   the one or more adjacent word lines comprise an erased word line which is after the selected word line in a programming order of the plurality of word lines, the erased word line is connected to erased memory cells and is not connected to programmed memory cells, and a programmed adjacent word line which is before the selected word line in the programming order of the plurality of word lines and is connected to programmed memory cells; and
   the down coupling reduces voltages of the erased and programmed word lines to different respective minimum levels, the respective minimum level of the programmed adjacent word line is greater than the respective minimum level of the erased adjacent word line.

8. The method of claim 7, wherein:
   the respective minimum level of the programmed adjacent word line is sufficiently high to provide the programmed memory cells in a conductive state during the sensing operation; and
   the respective minimum level of the erased adjacent word line is sufficiently high to provide the erased memory cells in a conductive state during the sensing operation.

9. The method of claim 7, wherein:
an amount of down coupling from the erased adjacent word line is more than an amount of down coupling from the programmed adjacent word line.

10. The method of claim 1, wherein:
the sensing operation comprises an erase-verify operation for even-or-odd-numbered word lines of the plurality of word lines; and
each of the even-or-odd-numbered word lines is down coupled by at least one adjacent word line of the plurality of word lines in preparation for the performing of the sensing operation.

11. The method of claim 1, wherein:
the sensing operation comprises a program-verify operation or a read operation; and
one or more remaining word lines of the plurality of word lines, other than the one or more adjacent word lines, have a fixed voltage during the floating of the selected word line and do not down couple the selected word line.

12. A non-volatile storage apparatus, comprising:
a set of memory cells;
a plurality of word lines, each word line of the plurality of word lines is connected to respective memory cells in the set of memory cells, the plurality of word lines comprises a selected word line and one or more adjacent word lines of the selected word line;
a set of word line drivers comprising a word line driver connected to the selected word line, and one or more word line drivers connected to one or more adjacent word lines;
sensing circuitry associated with the set of memory cells; and
a control circuit associated with the set of word line drivers and the sensing circuitry, the control circuit:
  causes the word line driver connected to the selected word line to drive the selected word line at a driven level,
  to down couple the selected word line to a down coupled level, below the driven level, causes the word line driver connected to the selected word line to float a voltage of the selected word line while causing the one or more word line drivers connected to the one or more adjacent word lines to decrease a voltage of the one or more adjacent word lines, and
  while the voltage of the selected word line floats and is at the down coupled level, cause the sensing circuitry to perform a sensing operation which involves the selected word line.

13. The non-volatile storage apparatus of claim 12, wherein:
the control circuit, during the driving of the selected word line at the driven level, causes the one or more word line drivers connected to the one or more adjacent word lines to increase the voltage of the one or more adjacent word lines.

14. The non-volatile storage apparatus of claim 12, wherein:
the one or more adjacent word lines comprise an erased word line which is after the selected word line in a programming order of the plurality of word lines, the erased word line is connected to erased memory cells and is not connected to programmed memory cells, and a programmed adjacent word line which is before the selected word line in the programming order of the plurality of word lines and is connected to programmed memory cells;
the down coupling reduces voltages of the erased and programmed word lines to different respective minimum levels, the respective minimum level of the programmed adjacent word line is greater than the respective minimum level of the erased adjacent word line; and
an amount of down coupling from the erased adjacent word line is more than an amount of down coupling from the programmed adjacent word line.

15. The non-volatile storage apparatus of claim 12, wherein:
the sensing operation comprises an erase-verify operation for even-or-odd-numbered word lines of the plurality of word lines; and
each of the even-or-odd-numbered word lines is down coupled by at least one adjacent word line of the plurality of word lines in preparation for the sensing operation.

16. The non-volatile storage apparatus of claim 12, wherein:
the set of memory cells is in a NAND configuration.

17. The non-volatile storage apparatus of claim 12, further comprising:
the set of memory cells is in a NOR configuration.

18. A method for sensing in a memory device, comprising:
in response to a command to perform a sensing operation involving a selected word line of a plurality of word lines, providing a voltage on the selected word line by initially driving the selected word line at a driven level and subsequently down coupling the selected word line to a down coupled level, below the driven level; and
while the voltage of the selected word line is floating and at the down coupled level, sensing a state of a memory cell connected to the selected word line.

19. The method of claim 18, wherein:
the driven level is a non-negative voltage; and
the down coupled level is a negative voltage.

20. The method of claim 18, wherein:
the down coupling of the selected word line is achieved using one or more adjacent word lines of the selected word line.

* * * * *